(12) United States Patent
Park

(10) Patent No.: US 7,738,303 B2
(45) Date of Patent: Jun. 15, 2010

(54) METHOD OF ERASING A NONVOLATILE MEMORY DEVICE

(75) Inventor: Young Soo Park, Seoul (KR)

(73) Assignee: Hynix Semiconductor Inc., Icheon-si (KR)

(*) Notice: Subject to any disclaimer, the term of this patent is extended or adjusted under 35 U.S.C. 154(b) by 157 days.

(21) Appl. No.: 12/164,019

(22) Filed: Jun. 28, 2008

(65) Prior Publication Data
US 2009/0290427 A1  Nov. 26, 2009

(30) Foreign Application Priority Data
May 20, 2008  (KR) .................. 10-2008-0046604

(51) Int. Cl.
*G11C 11/34* (2006.01)
(52) U.S. Cl. .................. 365/185.29; 365/185.22; 365/203
(58) Field of Classification Search ............ 365/185.29, 365/185.22, 203
See application file for complete search history.

(56) References Cited
U.S. PATENT DOCUMENTS
7,460,410 B2 * 12/2008 Nagai et al. ............ 365/185.28

FOREIGN PATENT DOCUMENTS
KR  1020060070030 A  6/2006
KR  1020080007553 A  1/2008

* cited by examiner

*Primary Examiner*—Son Dinh
*Assistant Examiner*—Nam Nguyen
(74) *Attorney, Agent, or Firm*—Townsend and Townsend and Crew LLP

(57) ABSTRACT

The present invention relates to a method of erasing a nonvolatile memory device. According to an aspect of the present invention, an erase operation is performed on a selected memory block. The bit lines of the memory block are precharged, and a change of a voltage level of the bit lines is verified according to an erase state of the memory cells. A data read operation is performed on a first bit line according to a voltage level of the first bit line. A data read operation is performed on a second bit line according to a voltage level of the second bit line. The data read operation is performed on the second bit line after the data read operation is performed on the first bit line. An erase verify result is then determined according to the data read operation result.

21 Claims, 4 Drawing Sheets

METHOD OF ERASING A NONVOLATILE MEMORY DEVICE

CROSS-REFERENCES TO RELATED APPLICATIONS

The present application claims priority to Korean patent application number 10-2008-0046604, filed on May 20, 2008, which is incorporated by reference in its entirety.

BACKGROUND OF THE INVENTION

The present invention relates to an operation of a nonvolatile memory device and, more particularly, to a method of erasing a nonvolatile memory device, which can perform an erase verify operation on an even bit line and an odd bit line at the same time.

A flash memory device, a type of nonvolatile memory device, generally includes a plurality of strings in each of which a plurality of memory cells is connected in series. The flash memory device has been widely used in a variety of semiconductor devices, such as portable electronic devices, including notebook computers, personal digital assistants (PDAs) and mobile phones, computer bios, printers, and universal serial bus (USB) memory.

A memory cell array of a typical flash memory device has a structure in which memory cells are connected in series between bit lines BL and a cell source line CSL. In a NAND flash memory device, two transistors, including a drain select line DSL and a source select line SSL, are connected to electrically connect a memory cell to the bit line BL and the cell source line CSL.

In a memory cell of the above NAND flash memory device, a data program operation and an erase operation are performed by Fowler-Nordheim (F-N) tunneling generated through a tunnel oxide layer between floating gates according to voltage applied to a control gate or a substrate (or a bulk, PWELL).

A nonvolatile memory device includes several memory blocks, each comprised of a plurality of memory cells, and performs an erase operation on a per memory-block basis. After the memory block is erased, the memory block is subject to a hard erase verify operation and then soft program and verify operations, so that the memory cells have a threshold voltage of almost 0V, which is lower than 0V.

In more detail, after an erase operation is performed by applying a high voltage to a substrate of the memory block, an even bit line is selected and an erase verify operation is performed on the memory block, and an odd bit line is selected and an erase verify operation is performed on the memory block. The erase verify operations performed on the even bit line and the odd bit line differ only in the selection of the bit line, but are performed in the same manner.

The erase verify operation is similar to a program verify operation except that the threshold voltage of memory cells is determined to be 0V or less. The erase verify operation is performed by precharging a bit line, performing evaluation, latching data according to a bit line voltage, and discharging the bit line voltage in this order. Erase verify pass or fail is determined based on the latched data.

If an erase verify operation is carried out in this manner, verification must be performed on even and odd bit lines separately. Accordingly, in view of a total erase operation, an actual erase time is short, but a verify time is relatively longer. This becomes a more significant problem in nonvolatile memory devices including multi-level cells. That is, the erase verify operation requires not only a process of performing soft program and soft program verify operations but also a hard erase verification. Accordingly, if the soft program operation is not performed well, the time taken to perform the soft program verify operation is lengthened.

BRIEF SUMMARY OF THE INVENTION

The present invention is directed toward an erase method of a nonvolatile memory device, which can perform verification by selecting an even bit line and an odd bit line at the same time when performing an erase verify operation on nonvolatile memory devices.

According to a method of erasing a nonvolatile memory device in accordance with an aspect of the present invention, an erase operation is performed on a selected memory block. The bit lines of the memory block are precharged, and a change of a voltage level of the bit lines is verified according to an erase state of the memory cells. A data read operation is performed on a first bit line of the bit lines according to a voltage level of the first bit line. A data read operation is performed on a second bit line of the bit lines according to a voltage level of the second bit line. The data read operation is performed on the second bit line after the data read operation is performed on the first bit line. An erase verify operation result is determined according to a data read operation result.

When the erase verify result passes, soft program and verify operations are further performed.

A voltage level that precharges the bit lines for the erase operation is higher than a voltage level that precharges the bit lines for the program verify or data read operation.

If the erase verify operation does not pass, the erase operation is performed on the memory block by increasing an erase voltage, and the erase verify operation is again performed.

According to a method of erasing a nonvolatile memory device in accordance with an aspect of the present invention, an erase operation is performed on a memory block. A first bit line and a second bit line are precharged. A voltage level of the first and second bit lines is changed according to an erase state of a memory cell. Data according is latched to a voltage level of the first bit line. Data is latched according to a voltage level of the second bit line. Verification of the erase operation is determined based on a latch result.

The data latch of the second bit line is performed after the data latch of the first bit line.

If the erase operation does not pass, the memory block is erased by increasing an erase voltage by a step voltage.

If the erase operation passes, soft program and verify operations are performed.

A soft erase verify operation according to the soft program operation is performed.

The soft erase verify operation includes precharging the first bit line and the second bit line, changing the voltage of the first and second bit lines according to the erase state of the memory cell, latching data according to the voltage level of the first bit line, latching data according to the voltage level of the second bit line, and determining whether a soft erase operation passes based on the latch result.

A voltage level of the soft erase verify operation is higher than a voltage level of the erase verify operation, and the voltage level of the soft erase verify operation is lower than 0V.

DESCRIPTION OF SPECIFIC EMBODIMENTS

Specific embodiments according to the present invention will be described with reference to the accompanying drawings. However, the present invention is not limited to the disclosed embodiments, but may be implemented in various ways. The embodiments are provided to complete the disclosure of the present invention and to allow those having ordinary skill in the art to understand the scope of the present invention. The present invention is defined by the category of the claims.

Figure 1A:
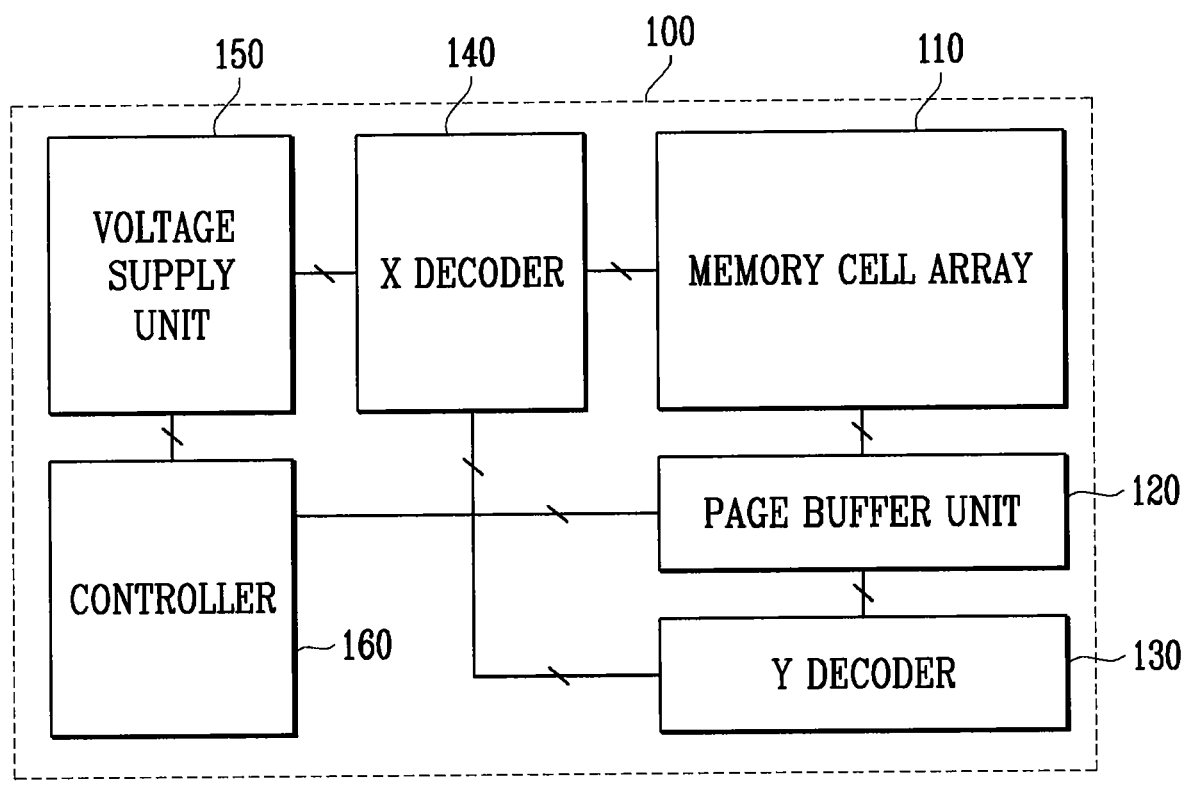
FIG. 1A is a block diagram of a flash memory device, for describing an embodiment of the present invention.

FIG. 1A is a block diagram of a flash memory device, for describing an embodiment of the present invention.

Referring to FIG. 1A, a flash memory device 100, that is, a nonvolatile memory device, includes a memory cell array 110, a page buffer unit 120, a Y decoder 130, an X decoder 140, a voltage supply unit 150 and a controller 160.

The memory cell array 110 includes a plurality of memory blocks in each of which a plurality of memory cells is connected by bit lines and word lines. The page buffer unit 120 includes page buffer circuits. Each page buffer circuit is connected to a pair of bit lines, and temporarily stores data to be programmed and supplies stored data to the bit lines, or reads data stored in the bit lines.

The Y decoder 130 receives a control signal of the controller 160 according to an input address and supplies a data input/output path of the page buffer circuits. The X decoder 140 selects the word lines of the memory cell array 110 according to an input address.

The voltage supply unit 150 generates operating voltages, such as a program voltage, a pass voltage, and an erase voltage, under the control of the controller 160. The controller 160 controls an overall operation of the flash memory device 100.

The page buffer circuit is described in more detail below.

Figure 1B:
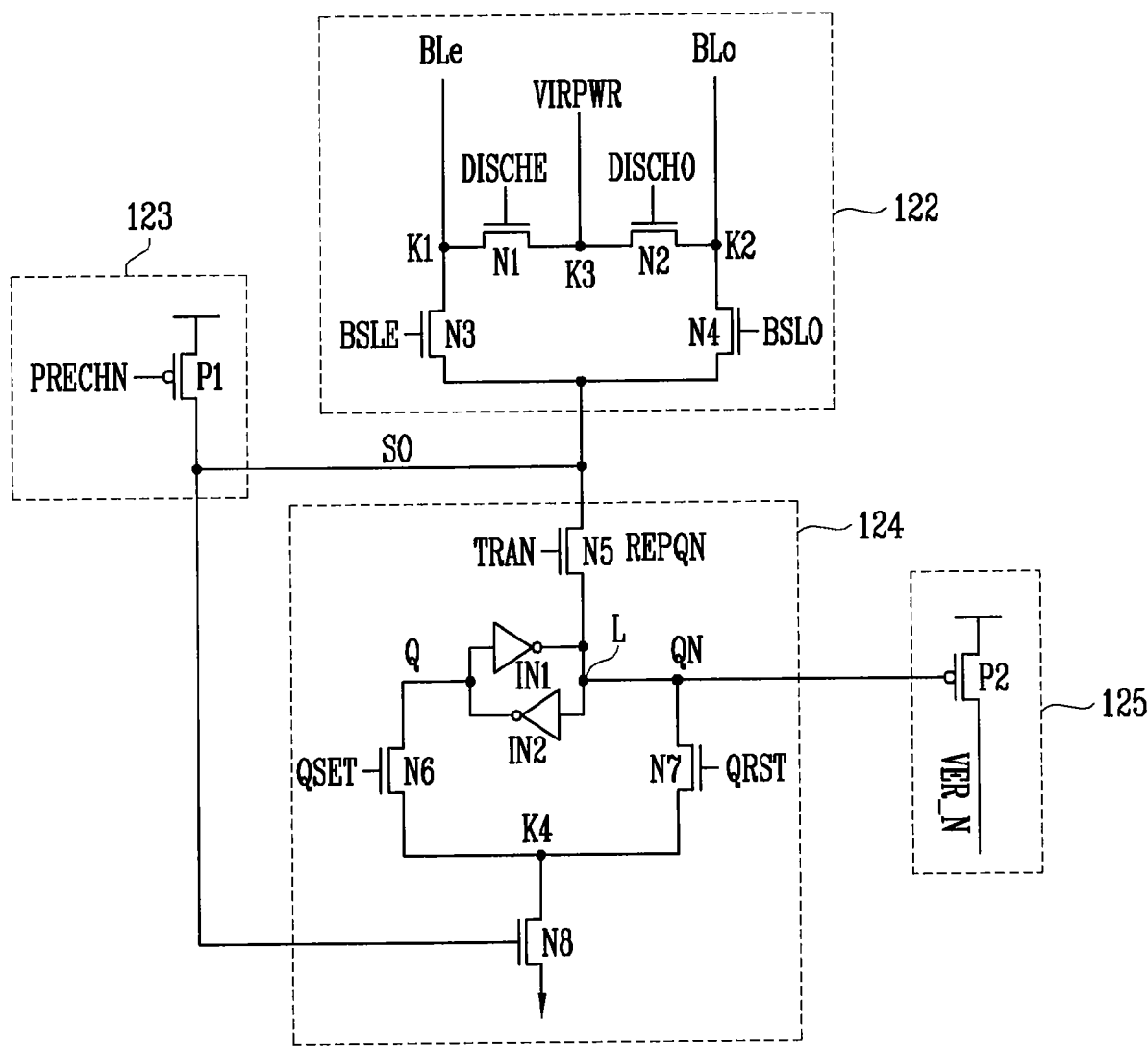
FIG. 1B is a circuit diagram showing a part of a page buffer circuit.

FIG. 1B is a circuit diagram showing a part of the page buffer circuit.

Referring to FIG. 1B, the page buffer circuit 121 includes a bit line select unit 122, a precharge unit 123, a latch unit 124 and a verify unit 125.

The bit line select unit 122 inputs or discharges a precharge voltage to an even bit line BLe and an odd bit line BLo and connects a selected bit line to a sensing node SO in response to the control signal.

The precharge unit 123 precharges the sensing node SO. The latch unit 124 latches data to be programmed, transfers latched data to the sensing node SO or senses a voltage level of the sensing node SO, and stores the sensing result. The verify unit 125 outputs a program or erase verify signal according to the data state of the latch unit 124.

The bit line select unit 122 includes first to fourth NMOS transistors N1 to N4. The precharge unit 123 includes a first PMOS transistor P1. The latch unit 124 includes fifth to eighth NMOS transistors N5 to N8 and first and second inverters IN1, IN2. The verify unit 125 includes a second PMOS transistor P2.

The first and second NMOS transistors N1, N2 are connected in series between a first node K1 and a first node K2.

A virtual power VIRPWR is input to a third node K3, that is, a connecting point of the first and second NMOS transistors N1, N2. The virtual power VIRPWR may be applied with a power supply voltage Vcc for precharging a bit line or may be applied with a voltage of 0V for discharging a bit line.

An even bit line discharge control signal DISCHE and an odd bit line discharge control signal DISCHO are applied to the gates of the first and second NMOS transistors N1, N2, respectively.

The third NMOS transistor N3 is connected between the first node K1 and the sensing node SO. An even bit line select control signal BSLE is applied to the gate of the third NMOS transistor N3.

The fourth NMOS transistor N4 is connected between the second node K2 and the sensing node SO. An odd bit line select control signal BSLO is applied to the gate of the fourth NMOS transistor N4.

The first PMOS transistor P1 of the precharge unit 123 is connected between a power supply voltage input terminal and the sensing node SO. A precharge control signal PRECHN is input to the gate of the first PMOS transistor P1.

The fifth NMOS transistor N5 of the latch unit 124 is connected between the sensing node SO and a node QN. A data transmission control signal TRAN is input to the gate of the fifth NMOS transistor N5.

The first and second inverters IN1, IN2 are connected to a latch L between a node Q and the node QN. The sixth NMOS transistor N6 is connected between the node Q and a fourth node K4. A set signal QSET is applied to the gate of the sixth NMOS transistor N6. The seventh NMOS transistor N7 is connected between the node QN and the fourth node K4. A reset signal QRST is input to the gate of the seventh NMOS transistor N7.

The eighth NMOS transistor N8 is connected between the fourth node K4 and a ground node. The gate of the eighth NMOS transistor N8 is connected to the sensing node SO.

The gate of the second PMOS transistor P2 of the verify unit 125 is connected to the node QN. The second PMOS transistor P2 outputs the power supply voltage as a verify signal VER_N or precludes the power supply voltage according to a voltage level of the node QN.

According to an embodiment of the present invention, in an erase operation of the memory block, an erase verify operation on the even bit line BLe and the odd bit line BLo coupled to the page buffer circuit 121 are performed at the same time.

Figure 2:
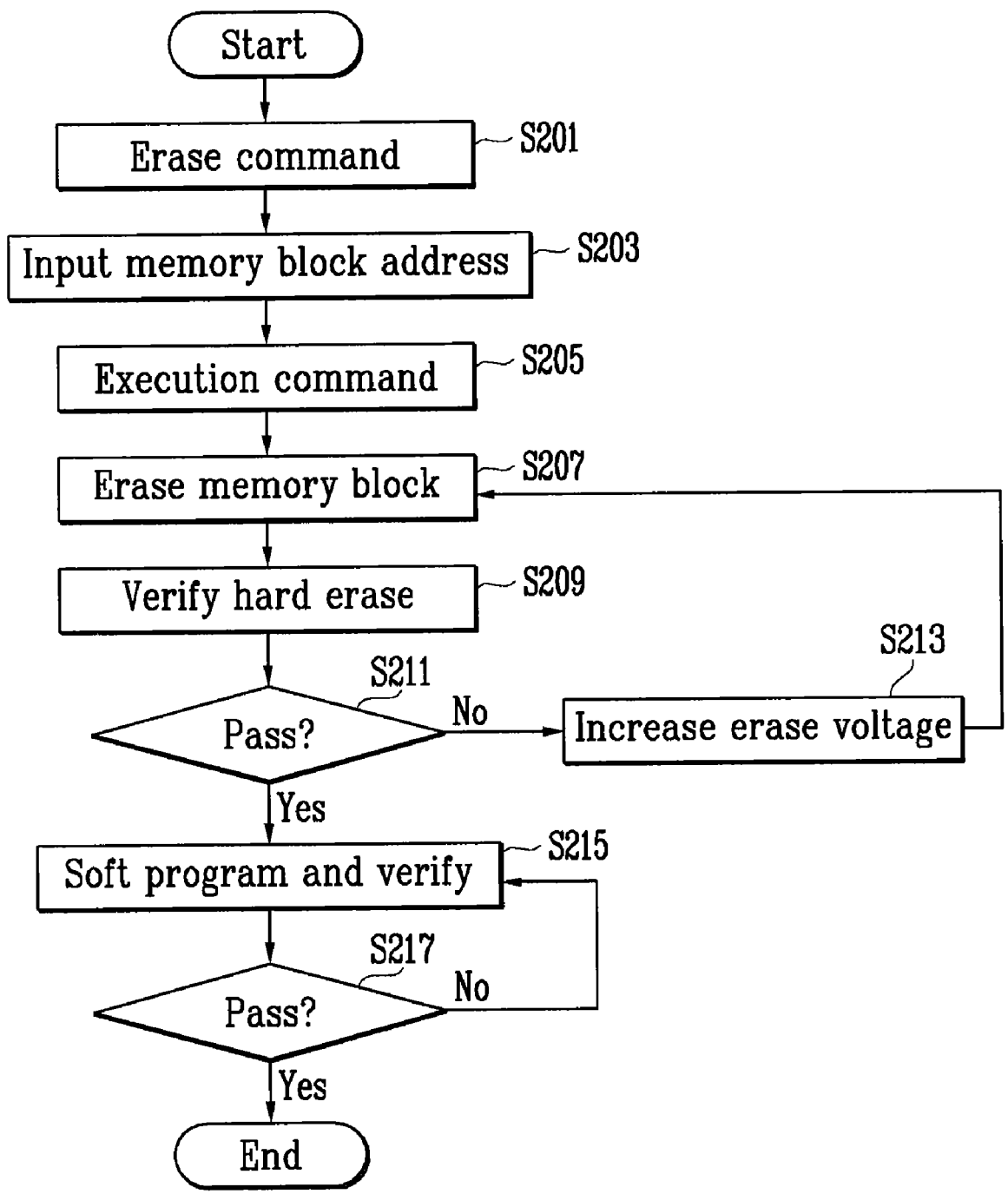
FIG. 2 is a flowchart illustrating an operation of an erase method of a nonvolatile memory device in accordance with an embodiment of the present invention.

FIG. 2 is a flowchart illustrating an operation of an erase method of the nonvolatile memory device in accordance with an embodiment of the present invention.

Referring to FIG. 2, when address information and an execution command for executing an erase command and an erase operation are input in steps S201 to S205, an erase operation is performed on a memory block based on the input address information in step S207.

In the erase operation, in the same manner as an erase method on a nonvolatile memory device, a high voltage is applied to a substrate to make the threshold voltage of memory cells 0V or less. When the memory cells are multi-level cells that are able to store data of 1 bit or more, the memory cells are programmed to have a threshold voltage belonging to the highest threshold voltage distribution, and a high voltage is applied to the substrate to erase the memory cells.

After the erase operation is performed in step S207, a hard erase verify operation is performed on the memory cells in step S209. The hard erase verify operation is performed to determine whether the memory cells have been erased (i.e., at a voltage level of 0V or less).

The hard erase verify operation is performed on the even bit line and the odd bit line at the same time according to an embodiment of the present invention. This is described in detail with reference to FIG. 3.

It is then determined whether the hard erase verify operation passes in step S211. If, as result of the determination in step S211, the hard erase verify operation passes, soft program and verify operations are performed to make the width of a threshold voltage distribution of the erased memory cells narrow and also closer to 0V in step S215. It is then determined whether the soft program verify operation passes in step S217. If, as result of the determination in step S217, the soft program verify operation passes, the erase operation is completed.

However, if, as result of the determination in step S211, the hard erase verify operation fails, the erase voltage is increased by a step voltage in step S213 and the process returns to step S207 in which the erase operation is performed on the memory block again. The erase voltage is applied while being increased by a predetermined step voltage from an erase start voltage according to an incremental step pulse erase (ISPE) method.

Even when soft verification is performed on the soft program in step S215, the even bit line and the odd bit line are verified at the same time.

Hard verification in step S209, which is executed in the erase operation, soft program verification in step S215, etc. are performed on the even bit line and the odd bit line at the same time according to the following method.

Figure 3:
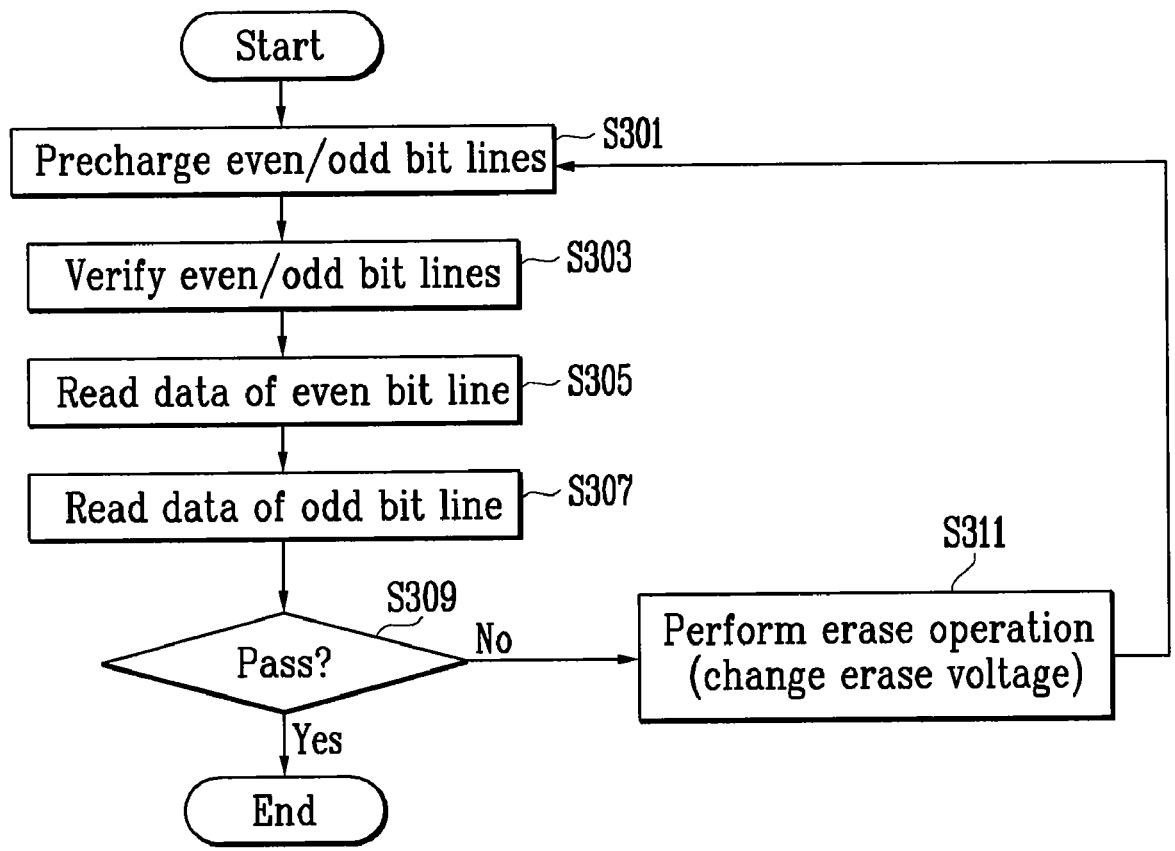
FIG. 3 is a flowchart illustrating an operation of an erase verify method in accordance with an embodiment of the present invention.

FIG. 3 is a flowchart illustrating an operation of an erase verify method in accordance with an embodiment of the present invention.

Reference will be made to FIG. 1B to describe in detail up to a process in which the page buffer circuit 121 operates when the operation of FIG. 3 is performed.

Referring to FIG. 3, it is assumed that a hard erase verify operation is first performed. The even bit line BLe and the odd bit line BLo are precharged at the same time in step S301. In order to precharge the even bit line BLe and the odd bit line BLo at the same time, the even bit line discharge control signal DISCHE and the odd bit line discharge control signal DISCHO are charged to a high level, thereby turning on the first and second NMOS transistors N1, N2 of the page buffer circuit 121. The virtual voltage VIRPWR has a voltage level for precharging the bit lines.

Thus, the even bit line BLe and the odd bit line BLo are precharged at the same time. The virtual voltage VIRPWR may preferably have a voltage level higher than that of a voltage applied for data read or program verification. This is because, as verification of a bit line voltage is performed on the even bit line BLe and the odd bit line BLo at the same time, there may be a bias drop due to interference.

When the even bit line BLe and the odd bit line BLo are precharged, the first and second NMOS transistors N1, N2 are turned off.

After the precharge step of the even/odd bit lines in step S301, a verify operation is performed on the even/odd bit lines at the same time as mentioned above in step S303.

In the hard erase verify operation, the word lines of the memory cells are applied with a voltage of 0V. However, in the case of a soft program verify operation, a soft program verify voltage suitable for the soft program verify operation is set and applied to the word lines.

If the memory cells have been normally programmed to 0V or less, a voltage applied to the even bit line and the odd bit line is discharged. The even bit line BLe and the odd bit line BLo become a low-level voltage state close to 0V. If any bit line has memory cells that have not been erased (i.e., at a voltage level of 0V or less), a precharged voltage level is maintained.

After the bit lines are verified, data is read by the page buffer circuit 121 using a bit line voltage. After data of the even bit line is read in step S305, data of the odd bit line is read in step S307.

The steps S305 and S307 are described in detail. In the latch L of the page buffer circuit 121, the node QN is set to a high level according to a reset operation. Before data is read, the precharge control signal PRECHN is applied as a low level to turn on the first PMOS transistor P1.

After the first PMOS transistor P1 is turned on, the sensing node SO is precharged. When the even bit line select control signal BSLE is input at a high level, the third NMOS transistor N3 is turned on. When the third NMOS transistor N3 is turned on, the even bit line BLe and the sensing node SO are connected.

If the memory cells connected to the even bit line BLe have been erased, the even bit line BLe has been discharged to a low level in step S303. Accordingly, the sensing node SO is also changed to a low level.

Thus, the eighth NMOS transistor N8 is turned on. The reset signal QRST of a high level is applied, thereby turning on the seventh NMOS transistor N7. The node QN is initially set to a high level according to a reset operation. However, if the eighth NMOS transistor N8 is turned off, the node QN maintains the high level without change even though the seventh NMOS transistor N7 is turned on.

When the node QN is at the high level, the second PMOS transistor P2 remains turned off. Thus, the verify signal VER_N is not output. When the erase verify operation is performed, if one verify signal VER_N is output, it is determined that the erase operation has failed.

After the data of the even bit line BLe is read, data of the odd bit line is read in step S307. The third NMOS transistor N3, which was turned on when reading the data of the even bit line BLe, is turned off and the sensing node SO is then precharged.

The odd bit line select control signal BSLO is applied at a high level to turn on the fourth NMOS transistor N4. The odd bit line BLo and the sensing node SO having a voltage level that has been verified in step S303 are connected.

If one of the memory cells connected to the odd bit line BLo has not been fully programmed, the odd bit line BLo maintains the precharged voltage even after the verification of the step S303 is performed.

Accordingly, although the sensing node SO and the odd bit line BLo are connected, the precharged high-level state is maintained. When the sensing node SO is at a high level, the eighth NMOS transistor N8 is turned on. The node QN maintains a high level according to a data read result of the even bit line BLe.

When the reset signal QRST is applied at a high level, the seventh NMOS transistor N7 is turned on. When the seventh NMOS transistor N7 is turned on, the ground node connected to the eighth NMOS transistor N8 and the node QN are connected, such that the node QN shifts to a low level.

When the node QN is at a low level, the second PMOS transistor P2 is turned on and the verify signal VER_N is output at a high level. Accordingly, the controller 160 determines that there is a memory cell that has not been fully erased. If there is a memory cell that has not been fully erased, the erase verify operation does not pass in step S309 and the erase operation is then performed again in step S311. The erase operation is performed again using an erase voltage that is increased by a step voltage.

This operation has the same result when the even bit line BLe does not pass and the odd bit line BLo passes. When the even bit line BLe and the odd bit line BLo pass at the same time, the second PMOS transistor P2 remains turned off.

Accordingly, although verification is performed such that the even bit line BLe and the odd bit line BLo are precharged and verified at the same time, and data of the even bit line BLe and the odd bit line BLo is read sequentially, an accurate verify result can be obtained. Further, a verify time can be shortened when compared with the existing method by precharging and verifying the even bit line BLe and the odd bit line BLo at the same time.

If verification passes in step S309, a voltage precharged by the even bit line and the odd bit line is discharged. In the discharge operation, the even bit line BLe and the odd bit line BLo become 0V by turning on the first and second NMOS transistors N1, N2 by applying the virtual voltage VIRPWR of 0V, and the even bit line discharge control signal DISCHE and the odd bit line discharge control signal DISCHO of a high level.

The erase verify operation of FIG. 3 has been described using as an example the hard erase verify operation of the erase operation performed on the memory block. It is to be noted that this operation may also be applied to a soft erase verify operation on a soft program in the same manner.

As described above, in accordance with the method of erasing a nonvolatile memory device according to the present invention, when an erase verify operation is performed, the even bit line and the odd bit line are selected and subject to the erase verify operation at the same time. Accordingly, a verify time can be reduced and a total erase time can be shortened.

The embodiments disclosed herein have been proposed to allow a person skilled in the art to easily implement the present invention, and the person skilled in the art may implement the present invention by a combination of these embodiments. Therefore, the scope of the present invention is not limited by or to the embodiments as described above, and should be construed to be defined only by the appended claims and their equivalents.

What is claimed is:

1. A method of erasing a nonvolatile memory device, the method comprising:
performing an erase operation on a selected memory block;
precharging the bit lines of the memory block;
verifying a change of a voltage level of the bit lines according to an erase state of memory cells of the memory block;
performing a data read operation on a first bit line of the bit lines according to a voltage level of the first bit line;
performing a data read operation on a second bit line of the bit lines according to a voltage level of the second bit line, wherein the data read operation is performed on the second bit line after the data read operation is performed on the first bit line; and
determining an erase verify result according to a data read operation result of the first and second bit lines.

2. The method of claim 1, further comprising, when the erase verify result passes, performing soft program and verify operations.

3. The method of claim 1, wherein a voltage level that precharges the bit lines is higher than a voltage level used for the program verify and data read operations.

4. The method of claim 1, wherein, in the event that the erase verify result does not pass, the erase operation is performed on the memory block by increasing an erase voltage, and an erase verify operation is performed.

5. A method of erasing a nonvolatile memory device, the method comprising:
performing an erase operation on a memory block;
precharging a first bit line and a second bit line;
changing a voltage of the first and second bit lines according to an erase state of a memory cell;
latching data according to a voltage level of the first bit line;
latching data according to a voltage level of the second bit line; and
determining whether the erase operation passed based on a latch result of the first bit line and the second bit line.

6. The method of claim 5, wherein the data latch of the second bit line is performed after the data latch of the first bit line.

7. The method of claim 5, wherein, in the event that the erase operation does not pass, the memory block is erased by increasing an erase voltage by a step voltage.

8. The method of claim 5, wherein, in the event that the erase operation passes, soft program and verify operations are performed.

9. The method of claim 8, wherein a soft erase verify operation is performed according to the soft program operation.

10. The method of claim 9, wherein the soft erase verify operation comprises:
precharging the first bit line and the second bit line;
changing the voltage of the first and second bit lines according to the erase state of the memory cell;
latching data according to the voltage level of the first bit line;
latching data according to the voltage level of the second bit line; and
determining whether a soft erase operation passes based on the latch result.

11. The method of claim 10, wherein a voltage of the soft erase verify operation is higher than a voltage of the erase verify operation, wherein the voltage of the soft erase verify operation is lower than 0V.

12. A method of erasing a nonvolatile memory device, the method comprising:
performing an erase operation on a selected memory block;
precharging a first bit line and a second bit line of the memory block, wherein the first bit line and the second bit line are precharged simultaneously;
verifying a change of a voltage level of the first and bit lines according to an erase state of corresponding memory cells of the memory cell block, wherein the change of the voltage level of the first bit line and the second bit line is verified simultaneously;
performing a data read operation on the first bit line according to a voltage level of the first bit line;
performing a data read operation on the second bit line according to a voltage level of the second bit line; and
performing an erase verify operation on the first bit line and on the second bit line, wherein the erase verify operation is performed on the first and second bit lines simultaneously; and
determining a result of the erase verify operation according to a data read operation result of the first and second bit lines.

13. The method of claim 12, further comprising, in the event that the result of the erase verify operation is pass, performing soft program and verify operations.

14. The method of claim 13, wherein a soft erase verify operation is performed according to the soft program operation.

15. The method of claim 14, wherein the soft erase verify operation comprises:
- precharging the first bit line and the second bit line;
- changing the voltage of the first and second bit lines according to the erase state of the memory cell;
- performing a data read of the first bit line according to the voltage level of the first bit line;
- performing a data read of the second bit line to the voltage level of the second bit line; and
- determining a result of a soft erase operation according to a data read operation result of the first and second bit lines.

16. The method of claim 12, wherein a voltage level that precharges the first and second bit lines is higher than a voltage level used for the program verify and data read operations.

17. The method of claim 12, wherein, in the event that the result of the erase verify operation is fail, the erase operation is performed on the memory block by increasing an erase voltage, and the erase verify operation is performed again on the first and second bit lines simultaneously.

18. The method of claim 12, wherein the data read operation is performed on the second bit line after the data read operation is performed on the first bit line.

19. The method of claim 12, wherein the first bit line corresponds to an even bit line and the second bit line corresponds to an odd bit line, the even bit line and the odd bit line being associated with the same bit line pair.

20. The method of claim 12, wherein the result of the erase verify operation is fail if at least one of the first and second bit lines is not erased.

21. The method of claim 12, wherein:
- performing the data read operation on the first bit line comprises latching data according to the voltage level of the first bit line; and
- performing the data read operation on the first bit line comprises latching data according to a voltage level of the second bit line.

* * * * *